United States Patent [19]

Fu et al.

[11] 4,342,617
[45] Aug. 3, 1982

[54] PROCESS FOR FORMING OPENING HAVING TAPERED SIDES IN A PLASMA NITRIDE LAYER

[75] Inventors: Chao-Hsiang Fu, San Jose; Sheau-Ming S. Liu, Los Altos, both of Calif.

[73] Assignee: Intel Corporation, Santa Clara, Calif.

[21] Appl. No.: 236,833

[22] Filed: Feb. 23, 1981

[51] Int. Cl.³ .................. B44C 1/22; C03C 15/00; H01L 21/306
[52] U.S. Cl. ..................... 156/643; 156/628; 156/653; 156/657; 156/662; 430/317; 427/94; 427/38
[58] Field of Search ............... 156/628, 643, 644, 653, 156/657, 659.1, 662; 427/38, 39, 88, 91, 94, 95, 86, 34; 29/580, 591; 430/317

[56] References Cited

U.S. PATENT DOCUMENTS

| | | | |
|---|---|---|---|
| 3,549,411 | 12/1970 | Bean et al. | 427/39 |
| 3,842,490 | 10/1974 | Seales | 29/580 |
| 4,181,564 | 1/1980 | Fogarty et al. | 156/657 |
| 4,239,587 | 12/1980 | Koel et al. | 156/628 |

Primary Examiner—Edward C. Kimlin
Assistant Examiner—F. K. Wine
Attorney, Agent, or Firm—Blakely, Sokoloff, Taylor & Zafman

[57] ABSTRACT

A process is described for forming a plasma nitride (SiNy) layer and a tapered opening through the layer so that the opening may more readily receive ohmic contacts. During the formation of the plasma nitride layer, more silane (over ammonia) is used to form a silicon rich upper portion of the layer. During the subsequent etching of this layer to form the opening, the silicon rich portion of the plasma nitride layer etches more quickly than the remainder of the layer and this results in the formation of the tapered opening through the layer.

6 Claims, 7 Drawing Figures

PROCESS FOR FORMING OPENING HAVING TAPERED SIDES IN A PLASMA NITRIDE LAYER

BACKGROUND OF THE INVENTION

1. Field of the Invention

The invention relates to the field of forming contact openings in insulative layers, particularly plasma nitride layers used in the fabrication of semiconductor devices.

2. Prior Art

Plasma nitride ($Si_x/N_y$) is most often used as a passivation layer formed over a final metal layer in semiconductor devices. It is typically used for low temperature "rear-end" processing. Thus, for the most part openings such as those needed for contacts are not formed through this layer.

It is often necessary in the fabrication of semiconductor devices to form contacts through insulative layers. For example, openings are etched through a glass layer (doped $SiO_2$) and then metal contacts are formed through the openings. These contacts can interconnect metal lines with substrate regions, interconnect metal or polysilicon members on one level with metal or polysilicon members on another level, and so on. It is well recognized that sharp corners in these openings can cause problems within the metalization. Typically, these corners result in high stress or thin regions in the metal which regions more readily crack. For a discussion of this problem and prior art solutions see "Investigation of Microcircuit Surface Metallurgy", 1969 Electronic Components Conference, Apr. 30–May 2, 1969, beginning at page 304; IBM Technical Disclosure Bulletin, Vol. 9, No. 4, September, 1966, entitled "Glassed Diode Aluminum Ohmic Contact"; and U.S. Pat. No. 3,825,442.

The present invention describes a process for forming a plasma nitride layer and opening therethrough which opening has tapered sides. This more readily permits the forming of contacts in the opening since better metal flow is obtained and high stress regions are minimized.

SUMMARY OF THE INVENTION

A process for forming a plasma nitride layer with an opening therethrough where the opening has tapered sides is described. The opening with its tapered sides is suitable for receiving a metal contact as the tapered sides provides better metal flow and reduces high stress regions within the metal. A first layer of plasma nitride is formed. Over this first layer, a second layer of plasma nitride is formed; the second layer having a higher etching rate than the first layer. Then, an opening is etched through the first and second layers of plasma nitride (or plasma oxynitride) with an ordinary masking member. The second layer etches at a faster rate than the first layer thereby providing an opening with tapered sides. In the presently preferred embodiment, the first and second layers of plasma nitride are integrally formed, and the higher etching rate of the upper portion of the layer is obtained by using more silicon.

DETAILED DESCRIPTION OF THE INVENTION

A process for forming a plasma nitride layer and opening therethrough is described. (Plasma nitride as used in this application is intended to cover plasma oxynitride also). In the following process, specific details are set forth such as specific flow rates and thicknesses of layers in order to provide a thorough understanding of the present invention. However, it will be obvious to one skilled in the art that these specific details are not required to practice the present invention. In other instances, well-known processing steps have not been described in detail in order not to obscure the present invention in unnecessary detail.

In the following description, the formation of an opening through a plasma nitride layer is described which provides contact to an underlying substrate region. It will be obvious that openings through plasma nitride layers may be formed in the described manner for interconnecting metal layers, polysilicon layers, polysilicon to metal layers, and other interconnections.

Figure 1:
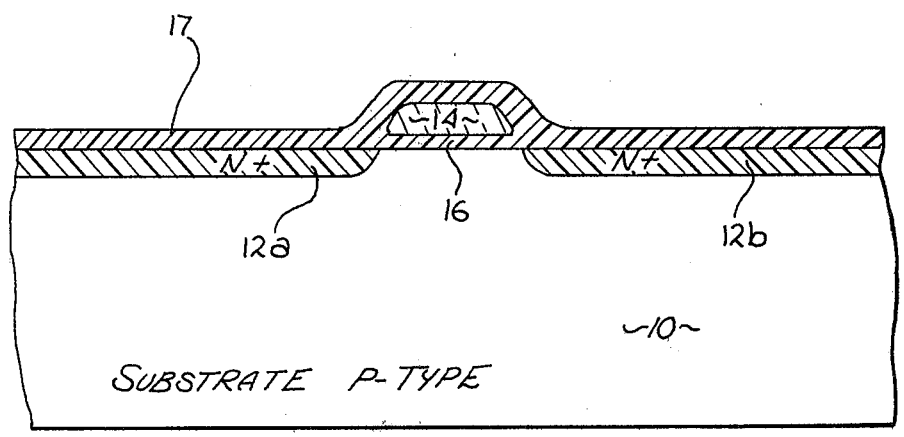
FIG. 1 is a cross-sectional elevation view of a portion of a substrate which includes a gate member, source and drain regions with an overlying oxide layer.

Referring first to FIG. 1, a substrate 10 is illustrated, which for the described embodiment, is a p-type monocrystalline silicon substrate (50 ohm-cm.) having a crystalline orientation of (100). Employing well-known metal-oxide-semiconductor (MOS) processing, a polysilicon gate member 14 is formed over the substrate which is insulated from the substrate by a gate oxide layer 16. Source and drain regions 12a and 12b are formed in alignment with the polysilicon gate member 14. Then an additional oxide layer 17 is grown over the substrate. By way of example, the gate oxide layer 16 may have a thickness of approximately 250 A, the gate member 14 a thickness of approximately 3000 A, and the source and drain regions doped to a level of approximately $10^{20}/cm^3$ ion implantation with arsenic. The layer 17 is formed with a re-oxidation step and in the presently preferred embodiment, is approximately 700 A thick.

Figure 2:
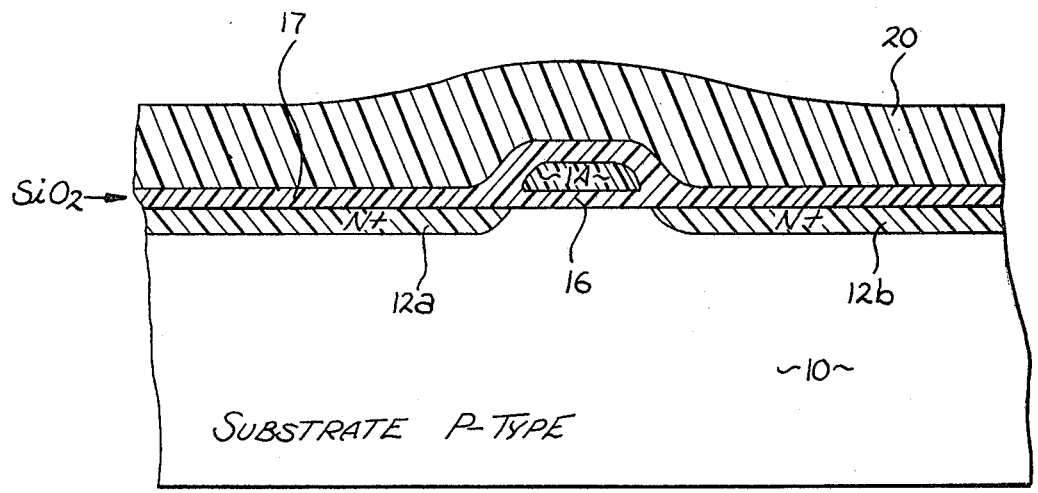
FIG. 2 illustrates the substrate of FIG. 1 with a first plasma nitride layer formed thereon.

Referring to FIG. 2, next a plasma nitride ($SiN_y$) layer 20 of approximately 1 micron is formed over the oxide layer 17 with a known process. Silane ($SiH_4$) and ammonia ($NH_3$) are used in a reactor to form the plasma nitride. The process is available from Pacific Western, Elko, Nev.

Figure 3:
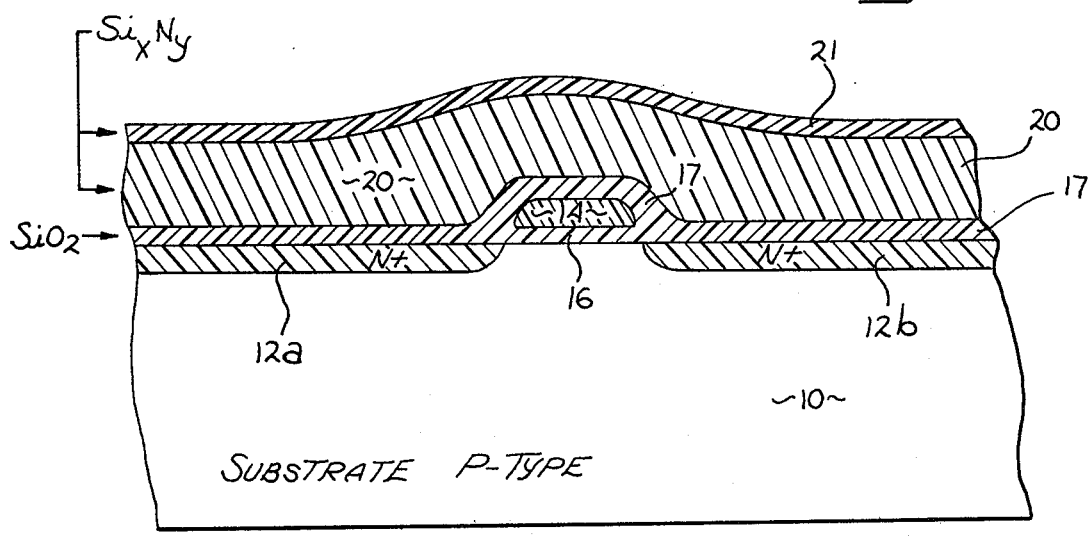
FIG. 3 illustrates the substrate of FIG. 2 with a second plasma layer formed thereon.

Now as shown in FIG. 3, a second layer 21 of plasma nitride is formed over the layer 20. The second layer 21 is substantially thinner than the layer 20 and importantly, has a faster etching rate than the layer 20. The layer 21 in the presently preferred embodiment is approximately 500–1000 A thick.

In the presently preferred process, the layers 20 and 21 are integrally formed without removing the wafers from the reactor. During the formation of the plasma nitride, a richer silane mixture is used to form the upper portion of the layer (layer 21). By way of example, during the formation of the major portion of the layer, a flow rate of 350 ml/min. of silane is used, along with a flow rate of 415 ml/min. of ammonia. When approximately 1 micron of the plasma nitride has been formed over the substrate (layer 20) then the flow of ammonia is reduced to approximately 300 ml/min. These proportions of silane and ammonia are used to form a layer of approximately 500–1000 A thick, shown as layer 21 of FIG. 3. The layer 21 is richer in silicon than the layer 20 and etches at a faster rate than the layer 20.

Figure 4:
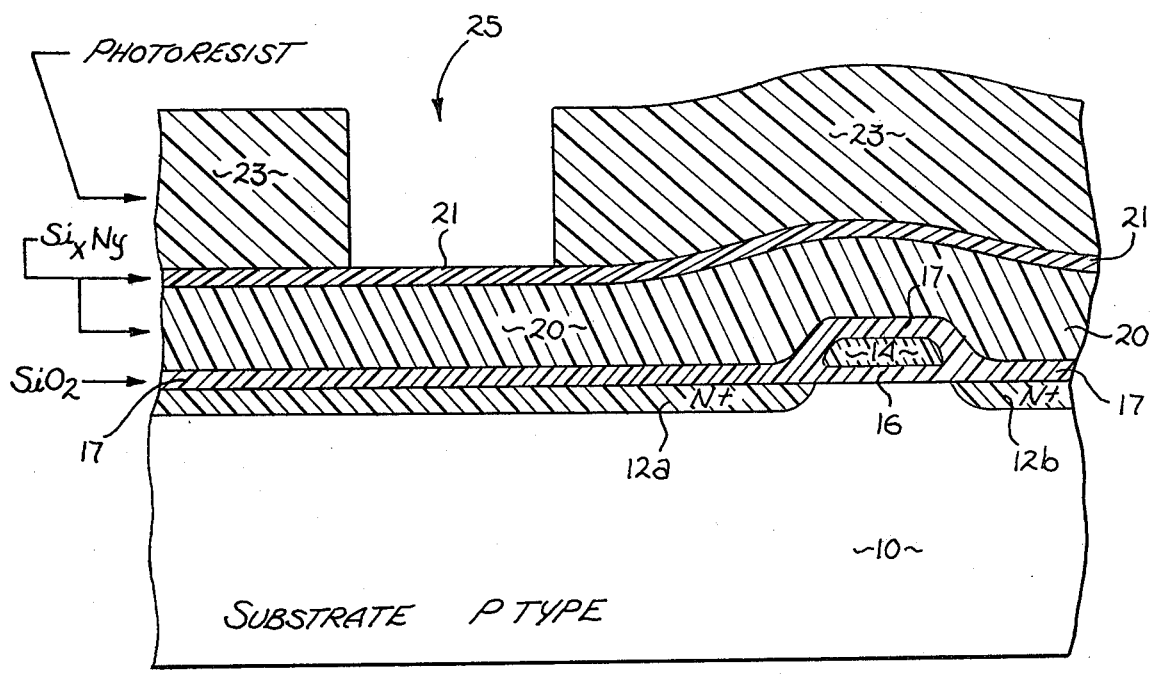
FIG. 4 illustrates the substrate of FIG. 3 after the formation of a photoresist layer and the formation of an opening through this layer. Note that the cross-sectional elevation view of FIG. 4 is shifted from the view of FIGS. 1 through 3 to better illustrate the region of the substrate lying to the left of the gate member.

Now referring to FIG. 4, a photoresist layer 23 is formed over the layer 21. This layer, by way of example, may be approximately 1.8 microns thick and formed with a positive photoresist. An opening 25 is formed through the layer 23 using ordinary photolithorgraphic techniques. This opening is formed above the region 12a.

Figure 5:
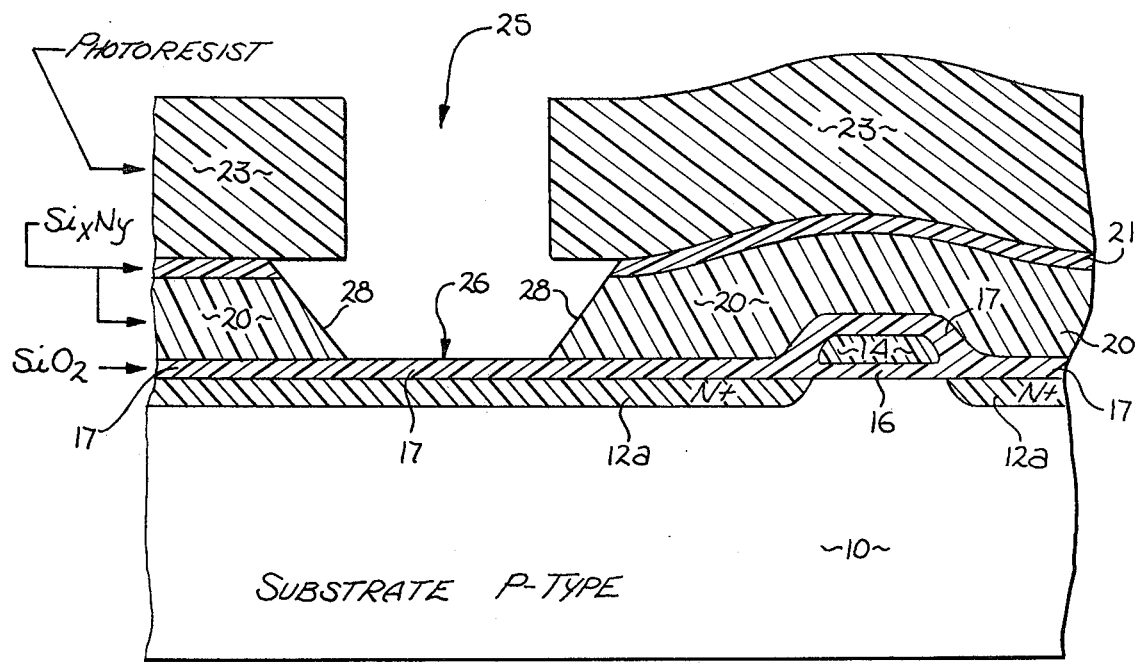
FIG. 5 illustrates the substrate of FIG. 4 after an opening having tapered sides has been etched through the plasma nitride layers.

Then, as shown in FIG. 5, a plasma nitride etchant is used to etch through the layers 20 and 21 in a single ordinary dry etching step (plasma etchant). The layer 21, as mentioned, etches at a faster rate than the layer 20, causing the undercutting beneath the photoresist layer 23 and providing the tapered walls, or sides 28 as shown in FIG. 5. The oxide layer 17 at the region 26 forms an etchant stop and prevents the etchant from attacking the substrate.

Figure 6:
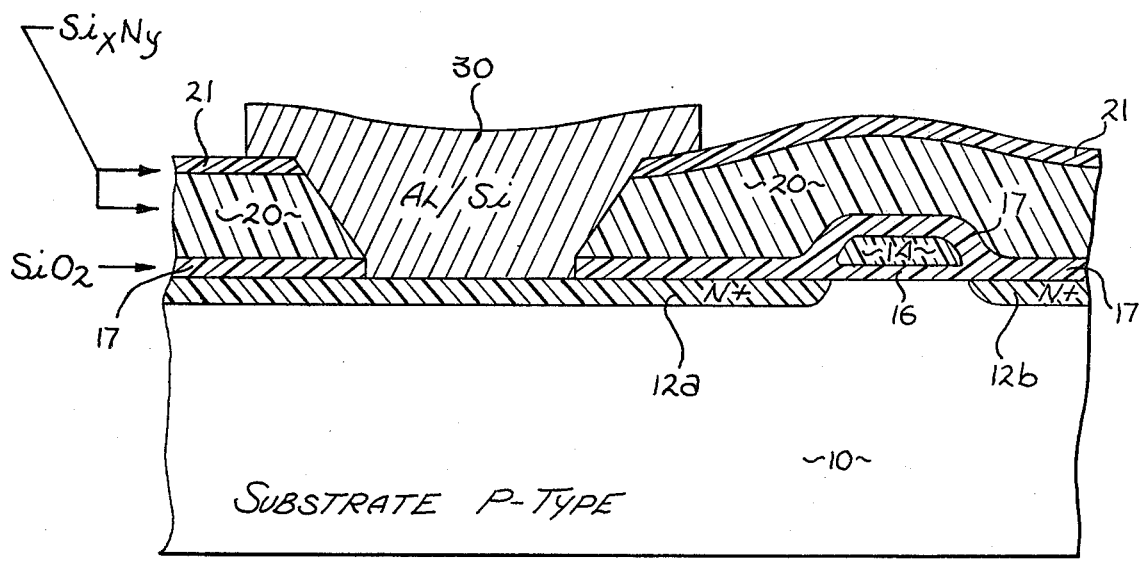
FIG. 6 illustrates the substrate of FIG. 5 after an opening has been etched through the oxide layer and an ohmic contact formed in the opening.

Next, an oxide etchant is used to etch through the oxide layer 17 at the opening 25 and then the photoresist layer is removed. As shown in FIG. 6, a metal contact such as an aluminum silicon alloy contact 30 is formed in contact with the region 12a. The tapered opening eliminates the sharp corners thereby providing better metal flow and reduced high stress regions.

Figure 7:
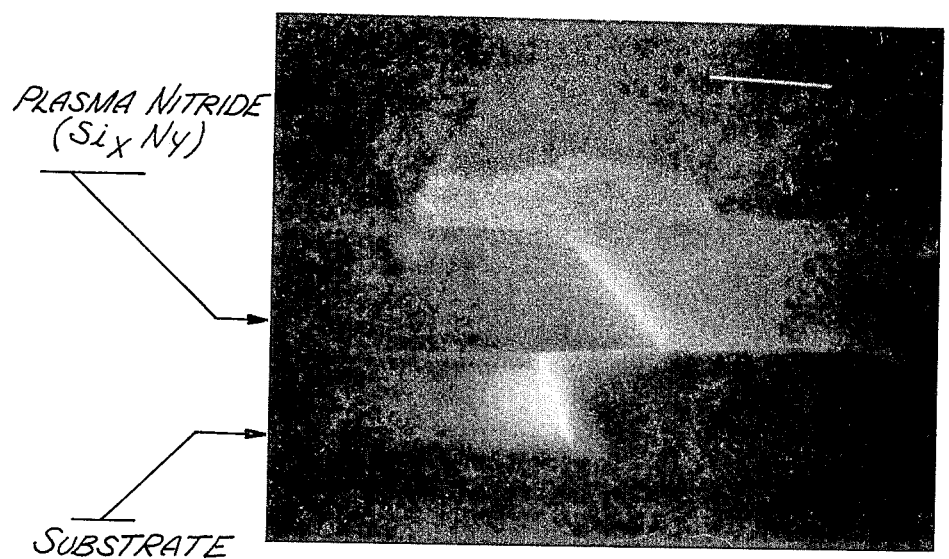
FIG. 7 is a photograph from a scanning electron microscope which shows an actual plasma nitride layer and opening made with the process of the present invention.

In practice, for the above-described processes the sides of the opening are at an angle of approximately 45 degrees to 55 degrees with respect to the substrate. This slope is obtained even though the faster etching plasma nitride is only 500–1000 A thick. In FIG. 7, an actual opening formed with the above-described process is shown. The substrate with its doped region is clearly seen as is the plasma nitride layer. The smooth taper of the opening through the plasma nitride region is vividly illustrated. The trace line in the upper right-hand corner of the photograph is 1 micron in length.

In some processes, a doped region (plug) may be necessary below the contact 30 to prevent "spiking" as is well-known in the prior art. Such region where necessary may be formed with the processing steps used to form buried contact regions, or a separate masking and doping step may be used before the formation of the layer 20.

Thus, a process for forming a plasma nitride layer and opening therethrough has been described which results in a tapered opening. The process allows greater use of plasma nitride, for example, in double-layer metal processing. The plasma nitride has the advantage of not requiring high temperature processing. The invented process may be used to form contacts between a metal or polysilicon layer and a substrate, between polysilicon layers and metal layers, and metal and polysilicon layers. Ohmic contacts of metal (or polysilicon) or like contacts can be made then, more reliably.

What is claimed is:

1. A process for forming a plasma nitride layer with an opening therethrough having tapered sides for receiving a contact member or the like, comprising the steps of:

forming a plasma nitride layer using silane and ammonia, including reducing the amount of ammonia relative to silane as the upper portion of said layer is formed to provide an upper portion of said layer which is richer in silicon than the remainder of said layer;

etching with a plasma etchant an opening through said plasma nitride layer such that said upper portion of said layer etches faster than said remainder of said layer, thereby providing an opening with tapered sides;

whereby contact member can be formed more readily in said opening because of said tapered sides.

2. The process defined by claim 1 wherein said upper portion of said plasma nitride layer is substantially thinner than said remainder of said layer.

3. The process defined by claim 2 wherein said remainder of said plasma nitride layer is approximately 1 micron thick and wherein said upper portion of said plasma nitride layer is approximately 500–1000 A thick.

4. A process for forming a plasma nitride layer with an opening therethrough having tapered sides for receiving a contact member or the like, comprising the steps of:

forming a silicon dioxide layer;

forming a plasma nitride layer over said silicon dioxide layer such that the upper portion of said plasma nitride layer is richer in silicon than the remainder of said layer;

etching with a plasma etchant an opening through said plasma nitride layer such that said upper portion of said plasma nitride layer etches at a faster rate than the remainder of said layer thereby providing an opening with tapered sides, said etching continuing until said silicon dioxide layer is reached, said silicon dioxide layer acting as an etchant stop;

whereby a contact member can be more readily formed in said opening because of said tapered sides.

5. The process defined by claim 4 including the step of etching through said silicon dioxide layer at said opening.

6. The process defined by claim 5 wherein said upper portion of said plasma nitride layer is relatively thin compared to the remainder of said layer.

* * * * *